United States Patent Office 3,409,487

Patented Nov. 5, 1968

3,409,487

USE OF A PHENOLIC RESIN AND ETHYLENE OXIDE POLYMER AS AN ETCHING RESIST

John S. Fry and Dale F. Pollart, Somerville, and Julius L. Silver, Somerset, Franklin Township, N.J., assignors to Union Carbide Corporation, a corporation of New York

No Drawing. Filed Nov. 9, 1964, Ser. No. 410,013

10 Claims. (Cl. 156—13)

ABSTRACT OF THE DISCLOSURE

An improved method of etching substrates wherein the substrate is held in intimate contact with an insolubilized membrane of an association product composed of a phenolic resin and an ethylene oxide polymer. The insolubilized membrane is characterized by areas of water permeability in accordance with the image to be etched. The substrate is subjected to a suitable water soluble etchant for the substrate through the membrane which passes etchant through to the substrate only in those areas of water permeability.

The present invention relates to an improved method of etching inorganic substrates. More particularly the present invention relates to a method of etching metallic and siliceous substrates with suitable water soluble etchants through a membrane held in contact with said substrates, said membrane being characterized by areas of water permeability and impermeability.

It has long been known in the art that various chemical compounds would uniformly attack certain inorganic materials. This property has been utilized extensively to clean the surfaces of various substrates such as metals and glass. This treatment is called etching. The corrosive chemical compounds used to attack the substrate materials have been known as etchants.

When the substrate material is provided with a coating which is not attacked by the etchant, selective etching can be obtained by scribing through the coating to the bare substrate or by merely selectively coating the surface with the coating. This coating is generally referred to as a mask or resist.

Selective etching has been utilized to provide substrates such as glass or metal with decorative designs, labeling and functional surfaces. Selective etching has also been utilized to provide outstanding printing surfaces commonly known as deep-etch printing plates.

In more recent times selective etching techniques have been used to prepare miniature elaborate circuit configurations on circuit boards of a metal foil such as copper laminated to a dielectric backing.

The masking techniques used in the past have been deficient in several respects, namely in that a high degree of skill is required by the technicians preparing the mask, the amount of time necessary to prepare the mask is great, and the degree of care required is also great. For example, the etching of glass is generally performed by coating the substrate with a wax which is hand scribed, which is both time consuming and demanding of skill. While machine scribing can be used, hand finishing is usually required to remove residual particles of wax.

Deep-etch printing plates are generally prepared by coating the substrate with photosensitive gelatin. The plate is exposed to light through a negative, insolubilizing the gelatin where it has been exposed to light. The plate is washed in water to remove soluble gelatin. The gelatin coatings are difficult to prepare and difficult to remove by washing. This procedure does, however, lend itself to photographic reproduction.

Printed circuit boards are masked by either time consuming hand methods with an inherent lack of reproducibility or are printed from expensive printing plates.

Until the present time few, if any, masking materials have been proposed which are easily prepared, and which can form continuous coatings requiring little skill which lend themselves to photographic reproduction and be readily used on any of the common inorganic substrates such as glass, silicia, and the various hard metals.

In accordance with the present invention an improved method of etching substrates is provided wherein the substrate is held in intimate contact with an insolubilized membrane of an association product composed of a phenolic resin and an ethylene oxide polymer. This insolubilized membrane is characterized by areas of water permeability in accordance with the image to be etched. The substrate is subjected to a suitable water soluble etchant for said substrate through the membrane which passes etchant through to the substrate only in those areas of water permeability.

The selective membrane of this invention can be used as a film which is held in intimate contact with the substrate to be etched or it can be applied as a coating to the substrate.

The selective membrane can be made water impermeable in image areas photographically by photosensitizing the membrane with a suitable photosensitizer or it can be rendered water impermeable through the desired application of a water impermeable polymeric resin such as phenolic resin, epoxy resin, polyvinyl chloride or the like.

Unlike the masking techniques proposed by the prior art the improved method of etching inorganic substrates as described in this invention can be carried out by technicians having a minimum of skill to prepare outstanding etched substrates.

This method lends itself particularly well to the preparation of deep-etch printing plates although it is equally applicable to the preparation of etched glass, etched silica wafers, and circuit boards.

The ethylene oxide polymer component of the compositions of this invention is selected from the resinous ethylene oxide polymeric materials having an average molecular weight in the range of from about 50,000 to about 10,000,000, which are readily soluble in water. The term "ethylene oxide polymers" refers to polymers possessing the repeating unit ($CH_2$—$CH_2O$—) as represented by the class of commercial Polyox resins; and the term is intended to include water soluble ethylene oxide polymer resins wherein ethylene oxide is the predominant monomer polymerized therein but which can also contain polymerized residues of other olefin oxides as exemplified by copolymers and terpolymers of ethylene oxide with other copolymerizable monomers containing single epoxide groups such as propylene oxide, butylene oxide, styrene oxide, and the like. Poly(ethylene oxide) homopolymer is, however, preferred as the ethylene oxide polymer resin and shall be used hereinafter as representative of these resins.

The phenolic resin component of the compostions of the present invention are the heat fusible condensation products of a phenol with an aldehyde. Such condensation products are divided into two classes, resoles and novolaks, either of which can be used in this invention as shown hereinafter. These two types of resins are discussed in order below. Both of these classes of phenolic resins will form in association with ethylene oxide polymers.

While these phenolic resins are in the fusible form when making the association product (as hereinafter more clearly set forth) the fusible condition is not necessarily a critical condition of the association product, in which it is possible for a portion of all of the phenolic resin component be fully advanced to the cured state.

The fusible resole phenolic resins can advance upon heating to a degree of cured and polymerization to attain a completely insoluble state. These insoluble phenolics cannot be used in the preparation of the present compositions but are believed to be present in the cured mask coatings of this invention. In the preparation of the present compositions only those heat fusible phenolic resins which are soluble in water, alkali or organic solvents such as acetone, ethanol and the like and which are sufficiently fusible to permit admixture and association with the ethylene oxide polymers can be used. These resins include those resole phenolic resins which have not cured to a degree of insolubility as well as the novolak resins discussed below.

RESOLE RESINS

Resole resins, are generally produced by the condensation of phenols and aldehydes under alkaline conditions. Resoles differ from novolaks in that polynuclear methylol-substituted phenols are formed as intermediates in resoles. A resole produced by the condensation of phenol with formaldehyde most likely proceeds through an intermediate having the following illustrated type structure:

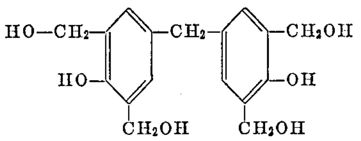

In a typical synthesis, resoles are prepared by heating one mole of phenol with 1.5 moles of formaldehyde under alkaline conditions.

The resole resins are prepared by the condensation of phenol with formaldehyde or, more generally, by the reaction of a phenolic compound, having two or three reactive aromatic ring hydrogen positions, with an aldehyde or aldehyde-liberating compound capable of undergoing phenol-aldehyde condensation. Illustrative of phenolic compounds are cresol, xylenol, ethylphenol, butylphenol, naphthal, 2,2-bis(p-hydroxyphenyl) propane, and the like. Illustrative of aldehydes are formaldehyde, acetaldehyde acrolein, crotonaldehyde, furfural, and the like. Illustrative of aldehyde-liberating compounds are for example, paraformaldehyde, formalin and 1,3,5-trioxane. Ketones such as acetone are also capable of condensing with phenolic compounds, as are methylene engendering agents such as hexamethylenetetramine.

The condensation of phenolic compound and aldehyde is conducted in the presence of alkaline reagents such as sodium carbonate, sodium acetate, sodium hydroxide, ammonium hydroxide, and the like. When the condensation reaction is completed, if desired the water and other volatile materials can be removed by distillation, and the catalyst neutralized.

NOVOLAK RESINS

The novolak resins are prepared in a manner similar to that used to prepare the resole resins. The distinguishing exception in this preparation is however that the reaction is generally conducted in an acidic media, instead of an alkaline media as is the case with the resoles. When less than six moles of formaldehyde are used per seven moles of phenol the products are permanently fusible and soluble. These are the novolak resins. The novolaks have a different structure than the resoles as is illustrated by the novolak condensation products of phenol with formaldehyde:

(a)

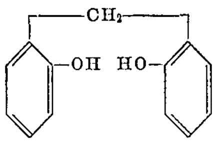

(b)

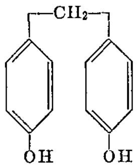

(c)

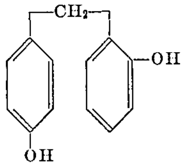

The novolaks can be further reacted with formaldehyde or with compounds such as hexamethylene tetramine, to a state of cure which is similar in the nature to the curing pattern of the resoles.

In a typical synthesis novolaks are prepared by heating one mole of phenol with 0.5 mole of formaldehyde under acidic conditions. The temperature at which the reaction is conducted is generally from about 25° C. to about 175° C.

The reactions which can be used in the preparation of the novolaks are the same as those used in the preparation of the resoles which are described and listed above.

While as previously stated both the resole resins and the novolak resins can be employed in the compositions of the present invention, it is preferred to use the resole resins. When the novolak resins are used it is necessary to add curing agents such as are normally used to convert these resins to thermosetting resins. Such agents include formaldehyde, hexamethylene tetramine, and the like.

The most suitable fusible resole resins are those which are insoluble in water but readily soluble in conventional organic solvents such as methyl ethyl ketone, acetone, methanol, ethanol, and the like. Resole resins having a particularly desirable combination of properties are those which have an average molecular weight in the range between about three hundred fifty and six hundred. It is believed that these resole resins contain an average of at least one methylol group per aromatic nucleus.

The phenolic resin-ethylene oxide association product membrane can be prepared by extrusion, calenderizing or as indicated above can be coated directly onto the substrate. These compositions can be coated by extrusion techniques or by solvent coating. Because of its convenience this last method is preferred.

Suitable solvents useful in the coating compositions of this invention are those which serve as solvents for all of the solute ingredients of the compositions in the amounts in which they are present. Illustrative of suitable solvents are dimethyl formamide, acetone/water in a 3:1 ratio, Cellosolve/water in a 4:1 ratio, dioxane and the like. Dimethyl formamide is the preferred solvent because of its excellent solubilizing characteristics.

The ratio of components in the photosensitive compositions must be within specific limits in order to obtain satisfactory results when the compositions are employed in the preparation of etching mask coatings. The quantity of ethylene oxide polymer in the compositions can vary between about 0.2 and 3 parts by weight per part of phenolic resin, with the preferred ratio being between about 0.6 and 1.8 parts of ethylene oxide polymer per part of phenolic resin.

The amount of solvent useful in the coating compositions of this invention is dependent upon the thickness of the plate coating desired and viscosity requirements. Generally, however, amounts of from 5 to 50 milliliters of solvent are used per gram of the total remaining ingredients i.e. the solutes.

The coating compositions of this invention are easily prepared by dissolving the various ingredients in the solvent.

Suitable photosensitizing agents are those which when acted upon by light energy at ambient temperatures release free radicals capable of reacting with the resinous components of the printing plate surfaces. While many such photosensitizers are known to the art it has been found that partially suitable photosensitizers for the compositions of the present invention are the haloalkanes wherein the halogen substituents exhibit an atomic weight greater than 37. The haloalkanes wherein the alkane moiety contains from one to six carbon atoms and the halogen substituent is either iodine or bromine is particularly effective.

Particularly preferred as the polyhaloalkanes wherein more than one halogen atom is substituted on the same carbon atom. Illustrative of useful photosensitizing agents are iodoform, bromoform, methyl iodide, dibromoethane, tetraiodoethane, diiododibromobutane, hexabromohexane, and the like.

The photosensitizing ability of the various alkane iodides or bromides is a function of quantum yield [1] which in turn depends on the chemical structure of the respective iodides or bromides. Generally, the quantum yield increases as the number of halogen atoms in the compounds increases, and as the length of the hydrocarbon chain increases. The quantum yield is also higher if the iodine atoms are on a tertiary carbon atom rather than a primary or secondary carbon atom. On this basis, the photosensitizing ability of various iodides, in the order of increasing efficiency, is exemplified by the following sequence:

$$CH_3I<CH_3CH_2I<CH_3(CH_2)_2I<CH_3(CH_2)_3I<(CH_3)_3CI<CH_2I_2<CHI_3$$

Iodoform is a particularly outstanding photosensitizing agent in the practice of the present invention. Other photosensitizers which can be used alone or in combination with haloalkane photosensitizers include the bromo and iodo substituted alcohols containing from about 2 to about 8 carbon atoms inclusive such as 2-bromo ethanol, 2,3-diiodo propanol, 1,1,3,3-tetraiodo-2-propanol, 1,1,1-tribromo-2-butanol, 1,1,1,5,5,5-hexaiodo-3-pentanol, 1,1,1-tribromo-2-octanol, and the like; the bromo and iodo substituted ketones containing from 3 to 13 carbon atoms such as dibromoacetone, tetraiodo diethyl ketone, hexabromo dipropyl ketone, brominated acetophenone, iodinated benzophenone, and the like; the light sensitive diazo and diazonium compounds (diazoliths), azides and water-soluble hexavalent chromium compounds. As used herein, the term "diazo" is meant to include diazonium and azido compounds. Illustrative of the classes of photosensitizers are rosin derivatives of diazonaphthol- and diazophenol-sulfonamides; ortho-quinonediazide; condensation products of diazo-diarylamine and formaldehyde; 4,4′-diazidostilbene-2,2′-disulfonic acid salts; azidostyrylketones of the type described in French Patent No. 886,716 such as 4-azidobenzalacetone-2-sulfonic acid salts; 1,5-diazido-naphthalene-3,7-disulfonic acid salts; 4-azidonaphthalene-1,8-dicarboxylic acid salts; 4,4′-diazido-diphenylmethane-3,5-dicarboxylic acid salts; 2-diazo-1-hydroxynaphthalene-5-sulfonic acid salts; para-diazodialkylanilines; para-diazophenylmorpholine; paradiethyl amino benzene diazonium fluoborate; 2-methyl benzene diazonium fluoborate; para-fluorophenyl diazonium fluoroborate; 1,5-naphthalene tetrazonium fluoborate; ammonium chromate; ammonium bichromate; sodium chromate; sodium bichromate; potassium chromate, potassium bichromate, and the like.

The photosensitizing agent can be incorporated into the coating composition, can be applied to surface of the baked coating composition or if multiple sensitizers are to be used one or more can be incorporated and the others subsequently coated on the surface. It should be noted however that it is not desirable to incorporate photosensitizers which volatilize or sublime at the baking temperatures for the association product coating as this results in high sensitizer loss.

When the photosensitizing agent is to be applied as a coating to the plastic base, it can be accomplished by coating from a solution in water, or any other convenient solvent, such as benzene, carbon disulfide, diethyl ether, ethyl acetate, acetone, methanol, ethanol, and the like. The photosensitizer solution can be applied by pouring, spreading, dipping, rolling, whirl-coating, wiping on or spraying in a conventional manner. The photosensitizer coating can be applied in multiple layers, with each layer being dried before the next one is applied so as to produce an overall coating of any desired thickness. However, it is one of the advantages of the present invention that excellent planographic plates can be produced with the application of a single-layer coating of photosensitizer.

The concentration of the photosensitizer in the solvent will control the thickness of the coating and this will influence the time needed for satisfactory exposure in the development of the printing plate. A preferred photosensitizer coating solution consists of between about ½ percent and 10 percent iodoform in acetone. The coating can be applied by wiping on the solution with a cloth, by pouring onto the plate in a whirler, or by any other conventional means.

The photosensitized coated substrate is exposed to a light source through a transparent pattern (e.g., a negative) to form an image on the photosensitive surface. The negative can be either continuous tone or half-tone type. The light source can be sunlight, carbon-arc light, mercury vapor light or other light source of suitable intensity.

It should be further noted that other additives can be present in the association product photoresists used in the process of the present invention. Such additives include curing catalysts such as the organic and inorganic acids and their acid metallic salt for example acetic acid, oxalic acid, benzene sulfonic acids, toluene sulfonic acids, sulfuric acid, hydrochloric acid, nitric acid, sodium acetate, sodium benzene sulfonate, aluminum chloride, aluminum nitrate and the like; agents which serve to toughen the coating such as polyhydric phenols, as for example resorcinol, phloroglucinol and the like, agents which increase or otherwise affect the photoresponse of the composition such as oxidizing agents, as for example chromic acid, sodium bichromate, ammonium bichromate, ceric nitrate, ferric chloride, and the like, the organic sulfonic acids, such as the alkyl sulfonic acids as for example propyl sulfonic acid, tetramethylene sulfonic acid, the aryl sulfonic acids such as benzene sulfonic acid, toluene sulfonic acid, and the like and polynuclear hydrocarbons such as anthracene and the like.

Additionally such compositions can contain photo-responsive dyes which produce a visible image on exposure to light and provide the technician with a guide to exposure, as well as fillers, stabilizers, diluents, and the like.

As will be apparent to those skilled in the art some of these additives can perform more than one function and also that the additives can be used singly or in combinations.

While the membrane can be prepared as a self supporting film by casting, extrusion, calendering or the like and then held in intimate contact with the substrate, it is preferred to provide the membrane as a coating, because it is by its nature held in superior intimate contact.

When the association product membrane is applied as a coating to the substrate to be etched and dried, the membrane is soluble in the solvent from which it was cast. This membrane is also hydrophilic and water permeable. When the coating is insolubilized it becomes solvent insoluble but retains its hydrophilic, water permeable characteristics. The most convenient method of insolubilizing the membrane is by heating.

When the membrane is photosensitized and exposed to

[1] Quantum yield refers to the number of molecules reacting chemical per photon of light absorbed.

a light source through a negative or transparency those areas which are exposed become hydrophobic, water impermeable to a degree dependent upon the extent of exposure. Thus, when the membrane covered substrate is contacted with a water soluble etchant in aqueous solution, those areas which received no light absorb a maximum quantity of water soluble etchant which passes directly to the substrate. Those areas exposed to sufficient light to render them completely hydrophobic do not absorb the etchant, and those areas which during exposure received intermediate amounts of light accept an intermediate amount of etchant in proportion to the intensity of light they received. This apparent mechanism of acceptance and rejection of water and the water soluble etchants in proportion to light exposure provides outstanding masking of the substrate and the subsequent excellent reproduction.

Substrates which can be etched in accordance with the present invention include siliceous substrates such as glass, silica, quartz, and the like; metals such as copper, steel, iron, zinc, lead, tin, aluminum, magnesium, tungsten, gold, platinum, and the like, and their various alloys.

It should also be noted that the substrates can be used as self-supporting sheet or foil or can be used as foil laminates to a suitable substrate or even metallic coatings as are applied by plating or vapor deposition.

These substrates can be in almost any form of sheet, foil tube or other surfaces depending upon the use to which they are to be put. Suitable etchants are determined primarily by the substrate to be used. For example, when a siliceous substrate is used hydrofluoric acid is usually the type most suitable. When metals are used as the substrate materials, acids which will attack the substrate within a reasonable period of time are used. Such acids include nitric acid, sulfuric acid, hydrochloric acid, hydrobromic acid, and the like. When metallic substrates such as aluminum or magnesium are used, acidic or basic etchants such as the alkali metal hydroxides, i.e. sodium, potassium hydroxide, and the like, can be used. Generally, for the purposes of this invention, an etchant is suitably provided it is water soluble and will attack the substrate used within a reasonable period of time. It should be noted that it is desirable to use aqueous solutions of the etching agent. In certain cases, the aqueous solution can be provided by immersing the exposed coating in water and thereafter subjecting the coated substrate to a gaseous etchant such as anhydrous hydrofluoric acid, hydrochloric acid, nitric oxide, sulfur dioxide, and the like. If desired, mixtures of water with methanol, ethanol or isopropanol or other similar solvents can also be used.

Many etchants have been heretofore proposed for metal substrates. These etchants have long been used in the art for commercial etching. Any of these etchants can be used in the method of the present invention. The particular etchant selected is of course dependent upon the substrate to be etched.

For example, various etchants which can be used for copper include ammonium hydroxide in combination with hydrogen peroxide, ferric chloride, sulfuric acid, potassium arsenate, potassium permanganate, nitric acid, chromic acid, silver nitrate, copper ammonium chloride, ammonium persulfate, and the like.

Etchants which can be used for copper based alloys such as brass, bronze, German silver, and the like include nitric acid, ammonium hydroxide and hydrogen peroxide in combination, ferric chloride and hydrochloric acid in combination, ammonium persulfate, copper ammonium chloride, nitric acid and acetic in combination, nitric acid, acetic acid and acetone in combination, hydrochloric acid, sulfuric acid, nitric acid, sulfuric acid and potassium dichromate in combination, sulfuric acid and hydrogen peroxide in combination, and the like.

Etching agents for aluminum and aluminum alloys include, sodium hydroxide, hydrofluoric acid, hydrochloric and hydrofluoric acids in combination, nitric acid, ferric sulfate, sodium carbonate, sulfuric acid, hydrochloric acid-nitric acid and glycerine in combination, and the like.

Etchants for white metals such as lead, tin, zinc base and the like and alloys of such metals such as pewter include alcoholic nitric acid, hydrochloric acid, chromic oxide and sodium sulfate in combination, nitric acid and chromic acid in combination, iodine, silver nitrate, ferric chloride, ferric hydrochloride acid in combination.

Etchants suitable for use with magnesium include ethylene glycol and nitric acid in combination and the like.

Etchants for tungsten include ammonium hydroxide and hydrogen peroxide in combination, hydrogen peroxide, sodium hydroxide (used as an electrolytic etch) potassium ferrocyanide and the like.

Etchants for the noble metals such as gold, platinum and the like and their alloys include aqua regia and the like.

Precise formulations for etchant solutions is disclosed in great detail in the appendices of "Principles of Metallography" by Williams and Homerberg, McGraw-Hill Book Co., International Chemical series, 1939. Any of these etchant solutions can be used in the process of the present invention.

It will be appreciated that the etching can be accomplished on a metal or electrically conductive substrate by electrolytic etching.

Electrolytic etching is performed by passing a weak electric current through a suitable electrolyte in which the specimen to be etched is made the anode and a piece of platinum, aluminum, or other suitable metal is made the cathode. The electrolytes used may be weak acids, weak alkalis, ammonium molybdate, sodium thiosulphate, and the like.

The current strengths used in electrolytic etching as well as the electrolytes used in the etching bath are well known to the art and need not be elaborated here.

The substrate materials can be etched in accordance with this invention by dissolving a phenolic resin in a solvent such as dimethylformamide and thereafter mixing in an ethylene oxide polymer. This coating solution can be applied at the desired substrate in any of the conventional methods known to the art. Such methods include printing, dip coating, roll coating, knife coating, whirl coating, spraying, extrusion coating, and the like. Whichever method is used, however, it is desirable to provide a coating having a uniform thickness. The coated substrate is then conveniently insolubilized by heating to a temperature of from about 120° to about 200° C., and preferably from about 150° to about 190° C. and held for a period of time sufficient to insolubilize the coating. This period is generally from 5 to 30 minutes depending upon the temperature used. The substrate is then photosensitized by applying to the surface of the coating a suitable photosensitizing agent. The plate is then exposed to light through a photographic negative. The exposed plate is then subjected to the desired etchant. The degree of etching desired will generally determine the effective etching period as will the inherent resistance of the substrate to the etchant. This period can be as short as several minutes or as long as several days. Since it is usually desirable to obtain results quickly, the etchant selected should be one which rapidly attacks the substrate.

As indicated above the present invention can provide electrical printing circuit boards, deep etch printing plates as well as etched siliceous substrates. Measurement scales can be provided photographically with a high degree of criticality. Relatively large circuits can be reduced to microscopic proportions by photographic techniques and be faithfully reproduced in metal or silica. This latter method provides an exceptional, accurate means of providing legends and electrical circuits on silica wafers. Other applications of this invention will become readily apparent to those skilled in the art.

The following examples will serve to illustrate specific embodiments of the invention.

ILLUSTRATION I

This illustration exemplified the preparation of conventional phenolic resins useful in the practice of the present invention.

(a) Phenol-formaldehyde resole resin.—A mixture consisting of 1 mole of phenol, 3 moles of paraformaldehyde, 6 moles of water and 0.3 mole of sodium acetate trihydrate is refluxed at atmospheric pressure for a period of time between about two and one-half hours and three and one-half hours until the solution becomes cloudy. Two distinct phases begin to form as the resin precipitates from the refluxing mixture. Heating is continued for an additional five minutes and the hot mixture is then poured into water to completely precipitate the resin. The solid resin is recovered by filtration or decantation or other suitable separation method and washed thoroughly with water. The resin is dissolved in a suitable solvent such as methyl ethyl ketone, and anhydrous sodium sulfate is added to dry the solution. The water free solution is recovered by filtering out the sodium sulfate.

(b) Meta - cresol - formaldehyde resole resin.—Meta-cresol, paraformaldehyde and sodium acetate trihydrate in a molar ratio of 1:2.5:0.3, respectively, are mixed in water to form a dilute slurry (about 200 milliliters of water per mole of meta-cresol). This mixture is refluxed at atmospheric pressure until resin begins to precipitate, which is normally about a twenty-minute reaction period. The heating is continued an additional five minutes, and the reaction mixture is poured into cold water to completely precipitate the resin. An anhydrous solution of the resin in methyl ethyl ketone is prepared in the same manner as above.

(c) Resorcinol-formaldehyde resole resin.—A mixture of resorcinol, sodium sulfate and formalin (37 percent solution of formaldehyde in water) in a molar ratio of about 1:0.2:0.8, respectively, is dissolved in water (about 100 milliliters of water per mole of resorcinol). The reaction mixture is heated on a steam bath until the solution turns cloudy, then it is poured into cold water to completely precipitate the resin product. The resin is recovered and prepared as an anhydrous solution in methyl ethyl ketone in the manner described above.

(d) Phenol-formaldehyde novolak resin.—One-hundred grams of phenol is dissolved in 69 grams of 37 percent formalin solution and about 0.55 gram of oxalic acid is added. This mixture is refluxed at a temperature of about 80° C. for a period of about 6 hours at the end of which period the solution becomes cloudy. Water is then distilled from the reaction mixture until the temperature of the resinous mass reaches about 150° C. The resin is then discharged from the reaction vessel and allowed to cool. At room temperature the cooled resin is brittle and is readily pulverized to a powdery state.

Example I.—Etching a glass substrate

An association product coating composition is prepared having the following formulation:

| Component: | Parts by weight |
|---|---|
| Phenolic resin—Resole phenolic resin of phenol and formaldehyde as a 60% aqueous solution | 54 |
| Ethylene oxide polymer. A water soluble ethylene oxide homopolymer having a molecular weight of about 2–3 million and exhibiting a reduced viscosity of from 18 to 22 measured at a concentration of 0.2 gram in 100 milliliters of water | 48 |
| Ammonium dichromate | 3.6 |
| Phloroglucinol dihydrate | 2.4 |
| p-Toluene sulfonic acid (monohydrate) | 0.6 |
| Solvent—Dimethylformamide [1] | |

[1] 2400 milliliters.

The resinous components are dissolved in the solvent with the aid of a high speed vortex blender. The resultant solution is then gravity filtered.

Glass plates 6 inches square are coated with the association product coating composition utilizing a conventional whirl-coating apparatus. The coated glass plates are then baked for a period of 20 minutes at a temperature of 165° C. The coated plates are then photosensitized by applying a one percent solution in acetone to the coating of the substrate. The photosensitized plates are then covered with a photographic negative and exposed to an arc light for a period of about two minutes. The plates are placed in a water bath for a period of about ten minutes. The plates are dried by padding the coated surface of the plates with a water-methanol mixture, 1:1, and blotting dry. The plates are placed in a suitable chamber and exposed to the fumes of gaseous hydrogen fluoride for a period of about four minutes. The plates are then washed with water and the association product coating is removed. An etched image corresponding to the non-light exposed areas is clearly visible in photographic detail.

Example II.—Chemical etching of aluminum sheet

A nine mil aluminum sheet is coated with the coating composition of Example I, baked for 20 minutes at 165° C. and sensitized with iodoform as in Example I. After exposure through a negative to U.V. arc light for two minutes, the plate is soaked in a 5% solution of sodium hydroxide in water. The areas not exposed to light energy are observed to emit gas bubbles which presumably consist of hydrogen generated by the action of aqueous caustic on aluminum. After fifteen minutes, the plate is washed and the coating is removed in methylene chloride. An etched image remains corresponding to the original dark areas of the photo-negative. Aqueous ammonia and other common bases are also found to be useful as etching solutions.

Example III.—Electrolytic etching of steel

A 3" x 6" cold rolled steel panel is coated with the formulation of Example I and baked for 20 minutes at 165° C. After sensitizing in the 1% iodoform solution in acetone, the plate is exposed through a half tone negative to an arc light for 2 minutes. The plate is masked on the back with a water insoluble coating and placed in an electrolytic bath as the anode. A 1.5 v. battery is connected to the plate and to a copper bar which serves as the cathode. One gram of sodium chloride was added to the bath (800 ml. of water) and the system is operated for about 20 minutes. A precipitate of ferric hydroxide is observed to form in the bath. The plate is removed, washed and the coating removed with chlorinated solvents. An etched image of the negative remains. A magnifying glass examination reveals faithful reproduction of the half tone negative dots in the etched metal plate.

Example IV.—Electrolytic etching of copper

A photoresist coating composition having the following formulation is prepared:

| | Parts by weight |
|---|---|
| Phenolic resin—Phenol-formaldehyde resole resin having an average molecular weight of 440 | 8.0 |
| Ethylene oxide polymer—A water soluble ethylene oxide homopolymer having a molecular weight of about 2–3 million and exhibiting a reduced viscosity of from 18 to 22 measured at a concentration of 0.2 gram in 100 milliliters of water | 12.0 |
| Curing aid—Aluminim nitrate | 0.5 |
| Solvent—Dimethylformamide [1] | |

[1] 300 milliliters.

The solid components of the coating composition are dissolved in the solvent with the aid of a high speed vortex blender and the solution is filtered.

Copper foil is laminated to a bisphenol-A/epichlorohydrin polyhydroxy ether ("Phenoxy A")-glass cloth laminate by hot pressing at a temperature of 165° C. The copper foil surface is then coated with the photoresist coating composition through the utilization of a whirl-coating apparatus. The coated foil laminate was then baked for a period of 30 minutes at a temperature of 150° C. The photoresist coating is photosensitized by applying a one percent iodoform solution in acetone to the surface of the coating. A positive, continuous tone transparency is placed over the coating and then exposed to an arc light source for a period of three minutes. The foil lamina of the coated laminate is then made the anode in an electrolytic bath as in Example II. After a period of 30 minutes, the laminate is removed and washed. The photoresist coating is removed with methylene chloride solvent. An image remains etched into the copper foil. This image, when magnified, exhibits a random dot characteristic thereby indicating a continuous tone type of etching.

Extended treatment in the electroltyic bath results in the complete removal of copper in those areas which have not been exposed to light. This clearly indicates that printed circuits and other electrical systems can easily be reproduced from photographic transparencies.

It should be noted that deep etch metallic printing plates can be prepared in accordance with this invention in continuous tone. As indicated in Example IV above these plates are characterized by images formed of random dot printing surfaces.

What is claimed is:

1. A method for etching a predetermined pattern on an inorganic substrate which comprises providing on said substrate a water insoluble layer of a photosensitized association product of a phenolic resin and an ethylene oxide polymer which layer contains predetermined portions thereof which are water impermeable and water permeable, applying to said layer an aqueous solution of an etchant for said substrate, allowing said solution to permeate that portion of the layer which is water permeable and the etchant thereby making contact with said substrate.

2. The method of claim 1 wherein said water permeable portions are removed subsequent to said etchant making contact with said substrate.

3. The method of claim 1 wherein the photosensitized layer is insolubilized by heating.

4. The method of claim 1 wherein said water impermeable and water permeable portions are provided by exposing said water insoluble layer to light energy through a photographic transparency for a time sufficient to cause the exposed areas to become hydrophobic.

5. The method of claim 1 wherein the etchant is water soluble.

6. The method of claim 1 wherein the inorganic substrate is a siliceous substrate and the etchant is hydrofluoric acid.

7. The method of claim 1 wherein said water permeable portions are removed upon said etchant making contact with said substrate.

8. The method of claim 1 wherein the association product is photosensitized with iodoform.

9. The method of claim 1 wherein the inorganic substrate is a metallic substrate.

10. The method of claim 1 wherein said ethylene oxide polymer is present in an amount of from about 0.2 to 3 parts by weight per part phenolic resin.

References Cited

UNITED STATES PATENTS

| | | | |
|---|---|---|---|
| 3,169,065 | 2/1965 | Sorkin et al. | 96—33 |
| 3,285,745 | 11/1966 | Silver et al. | 96—90 |
| 3,231,377 | 1/1966 | Dickinson et al. | 96—33 |
| 3,309,202 | 4/1967 | Silver | 96—85 |

JACOB H. STEINBERG, *Primary Examiner.*

UNITED STATES PATENT OFFICE
CERTIFICATE OF CORRECTION

Patent No. 3,409,487 November 5, 1968

John S. Fry et al.

It is certified that error appears in the above identified patent and that said Letters Patent are hereby corrected as shown below:

Column 5, line 6, "partially" should read -- particularly --. Column 6, line 38, "salt" should read -- salts --. Column 7, line 40, "suitably" should read -- suitable --.

Signed and sealed this 3rd day of March 1970.

(SEAL)
Attest:

Edward M. Fletcher, Jr.
Attesting Officer

WILLIAM E. SCHUYLER, JR.
Commissioner of Patents